US012683388B2

(12) United States Patent　　　　　(10) Patent No.:　US 12,683,388 B2
Tanaka et al.　　　　　　　　　　　　(45) Date of Patent:　　Jul. 14, 2026

(54) SEMICONDUCTOR INTEGRATED CIRCUIT DEVICE

(71) Applicant: Socionext Inc., Kanagawa (JP)

(72) Inventors: Hidetoshi Tanaka, Yokohama (JP); Yuko Nagai, Yokohama (JP)

(73) Assignee: Socionext Inc., Kanagawa (JP)

( * ) Notice: Subject to any disclaimer, the term of this patent is extended or adjusted under 35 U.S.C. 154(b) by 351 days.

(21) Appl. No.: 18/596,231

(22) Filed: Mar. 5, 2024

(65) Prior Publication Data

US 2024/0213770 A1　　Jun. 27, 2024

Related U.S. Application Data

(63) Continuation of application No. PCT/JP2021/033115, filed on Sep. 9, 2021.

(51) Int. Cl.
*H02H 9/04*　　　(2006.01)
*H10W 20/40*　　(2026.01)

(52) U.S. Cl.
CPC .......... *H02H 9/046* (2013.01); *H10W 20/498* (2026.01)

(58) Field of Classification Search
CPC ..... H02H 9/046; H10W 20/498; H10D 84/00; H10D 84/038
USPC .......................................................... 361/56
See application file for complete search history.

(56) References Cited

U.S. PATENT DOCUMENTS 11,532,936 B2 * 12/2022 de Raad ................. H02H 9/005
12,451,686 B2 * 10/2025 Ahammed ........... H10D 89/611

2007/0120258 A1　5/2007　Hayashi et al.
2008/0169486 A1 *　7/2008　Toyoshima .......... H10D 89/601
　　　　　　　　　　　　　　　　　　　　257/203
2009/0050940 A1　2/2009　Hayashi et al.
2010/0090252 A1　4/2010　Toyoshima et al.
2010/0171177 A1　7/2010　Hayashi et al.
2011/0073914 A1　3/2011　Toyoshima et al.
2013/0265677 A1 *　10/2013　Prabhu ................... H02H 9/046
　　　　　　　　　　　　　　　　　　　　361/56
2013/0341728 A1　12/2013　Hayashi et al.
(Continued)

FOREIGN PATENT DOCUMENTS

JP　　2004-040009 A　　2/2004
JP　　2007-150150 A　　6/2007
(Continued)

OTHER PUBLICATIONS

International Search Report dated Nov. 9, 2021 issued in International Patent Application No. PCT/JP2021/033115, with English translation.

*Primary Examiner* — Dharti H Patel
(74) *Attorney, Agent, or Firm* — Rimon P.C.

(57)　　　　　　ABSTRACT

An IO cell includes an output circuit having an ESD protection diode, a protective resistance, and an output transistor. The protective resistance is constituted by a plurality of resistor elements formed in a first interconnect layer that is formed in an interconnect process (back end of line (BEOL)). The resistor elements are connected to interconnects formed in a second interconnect layer through vias. In the second interconnect layer, first power supply lines supplying first power are formed above the ESD protection diode. The first power supply lines have overlaps at positions in the X direction with the resistor elements.

10 Claims, 13 Drawing Sheets

(56)                    References Cited

U.S. PATENT DOCUMENTS

| | | | | |
|---|---|---|---|---|
| 2014/0268447 A1* | 9/2014 | Gudem | .................. | H03F 1/223 |
| | | | | 361/56 |
| 2015/0108579 A1 | 4/2015 | Hayashi et al. | | |
| 2015/0287724 A1 | 10/2015 | Hayashi et al. | | |
| 2016/0064373 A1* | 3/2016 | Narita | ................. | H10D 89/811 |
| | | | | 257/401 |
| 2016/0233154 A1 | 8/2016 | Hayashi et al. | | |
| 2017/0179112 A1* | 6/2017 | Narita | ................. | H10D 89/811 |
| 2018/0375497 A1* | 12/2018 | Hashimoto | ........... | H03K 3/011 |
| 2019/0304905 A1* | 10/2019 | Wee | .................... | H10D 89/611 |

FOREIGN PATENT DOCUMENTS

| | | | | | |
|---|---|---|---|---|---|
| JP | 2008-172121 A | 7/2008 | | | |
| JP | 2016-048761 A | 4/2016 | | | |
| JP | 2018-107171 A | 7/2018 | | | |
| JP | 2019-009345 A | 1/2019 | | | |
| WO | WO-2021090688 A1 * | 5/2021 | ............ | H10D 84/00 |

\* cited by examiner

2 CORE REGION

3 IO REGION 10  10a    10A

10a

CORE REGION

RU

6a LOW POWER SUPPLY
VOLTAGE REGION

Rsp

P1

A1

1b

7 HIGH POWER SUPPLY
VOLTAGE REGION

1a

A2

N1

Rsn

6b LOW POWER SUPPLY
VOLTAGE REGION

CHIP EDGE

Y

X

OUTPUT Tr P1

67          66

N-WELL

N + fin

P + fin

Gate 62    61

OUTPUT Tr N1

◫◫◫  N + fin

▯   Gate

SEMICONDUCTOR INTEGRATED CIRCUIT DEVICE

CROSS-REFERENCE TO RELATED APPLICATIONS

This is a continuation of International Application No. PCT/JP2021/033115 filed on Sep. 9, 2021. The entire disclosure of this application is incorporated by reference herein.

BACKGROUND

The present disclosure relates to a semiconductor integrated circuit device having a core region and an IO region placed on a chip, and more particularly to a layout structure of IO cells arranged in the IO region.

In a semiconductor integrated circuit, input/output (IO) cells are arranged around the core region, and input/output of signals from/to the outside of the semiconductor integrated circuit device, as well as supply of power, are performed through the IO cells.

In the recent miniaturization processes, it is a widespread practice to constitute the gate of a transistor by a high-k gate insulating film and a metal gate. This makes it difficult to use a non-silicided polysilicon resistance formed in the front end of line (FEOL: substrate process) as a resistor element. Presently, a resistor element made of a metal compound, such as titanium nitride, formed between metal interconnect layers in the back end of line (BEOL: interconnect process) has come into use.

United States Patent Publication No. 2019/0304905 discloses a semiconductor integrated circuit device in which a resistor element formed between metal interconnect layers in the BEOL is placed above a diode element as an electrostatic discharge (ESD) protection element, for example.

In the miniaturization processes, the ESD tolerance of a semiconductor integrated circuit is low. In designing the circuit, therefore, it is necessary to examine in detail the interconnect structure for improving the ESD tolerance as much as possible. However, no such examination has been made in the cited document.

An objective of the present disclosure is providing a configuration for improving the ESD tolerance in a semiconductor integrated circuit device using resistor elements formed in the BEOL.

SUMMARY

According to the first mode of the present disclosure, a semiconductor integrated circuit device including a plurality of IO cells arranged in a first direction is provided, wherein at least one of the plurality of IO cells includes an output circuit, the output circuit includes an external output terminal, a first electrostatic discharge (ESD) protection diode connected to the external output terminal at its first node and to a first power supply at its second node, a first protective resistance constituted by a plurality of resistor elements formed in a first interconnect layer, the first interconnect layer being formed in an interconnect process (back end of line (BEOL)), one of ends of the first protective resistance being connected to the external output terminal, and a first output transistor connected between the other end of the first protective resistance and the first power supply, the plurality of resistor elements of the first protective resistance are connected to interconnects formed in a second interconnect layer through vias, in the second interconnect layer, a first power supply line supplying power from the first power supply is formed above the first ESD protection diode, and the first power supply line has an overlap at a position in the first direction with any of the plurality of resistor elements of the first protective resistance.

According to the above mode, an IO cell includes an output circuit having a first ESD protection diode, a first protective resistance, and a first output transistor. The first protective resistance is constituted by a plurality of resistor elements formed in a first interconnect layer that is formed in an interconnect process (BEOL). The plurality of resistor elements of the first protective resistance are connected to interconnects formed in a second interconnect layer through vias. In the second interconnect layer, a first power supply line supplying first power is formed above the first ESD protection diode, and the first power supply line has an overlap with any of the plurality of resistor elements of the first protective resistance at positions in the first direction in which the IO cells are arranged. With this configuration, power supply lines supplying the first power can be abundantly provided in an interconnect layer above the first ESD protection diode. Therefore, since the resistance value of the route from the first power supply to the first ESD protection diode can be reduced, good ESD protection characteristics can be obtained.

According to the second mode of the present disclosure, a semiconductor integrated circuit device including a plurality of IO cells arranged in a first direction is provided, wherein at least one of the plurality of IO cells includes an output circuit, the output circuit includes an external output terminal, a first electrostatic discharge (ESD) protection diode connected to the external output terminal at its first node and to a first power supply at its second node, a first protective resistance constituted by a plurality of resistor elements formed in a first interconnect layer, the first interconnect layer being formed in an interconnect process (back end of line (BEOL)), one of ends of the first protective resistance being connected to the external output terminal, and a first output transistor connected between the other end of the first protective resistance and the first power supply, the plurality of resistor elements of the first protective resistance are connected to interconnects formed in a second interconnect layer through vias, in the second interconnect layer, a first power supply line supplying power from the first power supply is formed above the first output transistor, and the first power supply line has an overlap at a position in the first direction with any of the plurality of resistor elements of the first protective resistance.

According to the above mode, an IO cell includes an output circuit having a first ESD protection diode, a first protective resistance, and a first output transistor. The first protective resistance is constituted by a plurality of resistor elements formed in a first interconnect layer that is formed in an interconnect process (BEOL). The plurality of resistor elements of the first protective resistance are connected to interconnects formed in a second interconnect layer through vias. In the second interconnect layer, a first power supply line supplying first power is formed above the first output transistor, and the first power supply line has an overlap with any of the plurality of resistor elements of the first protective resistance at a position in the first direction in which the IO cells are arranged. With this configuration, power supply lines supplying the first power can be abundantly provided in an interconnect layer above the first output transistor. Therefore, a large current can be sufficiently passed through the first output transistor. Since this decreases the interconnect resistance to prevent or reduce the voltage drop, the operating frequency can be prevented from degrading and the quality of the signal waveform can be improved.

According to the present disclosure, in a semiconductor integrated circuit device using resistor elements formed in the BEOL, the ESD tolerance can be further improved.

DETAILED DESCRIPTION

Embodiments of the present disclosure will be described hereinafter with reference to the accompanying drawings. In the following description, it is assumed that "VDDIO" and "VSS" indicate power supply voltages or power supplies themselves. It is also assumed that transistors are formed on a P-substrate and an N-well. Note however that transistors may be formed on a P-well and an N-substrate.

First Embodiment

Figure 1:
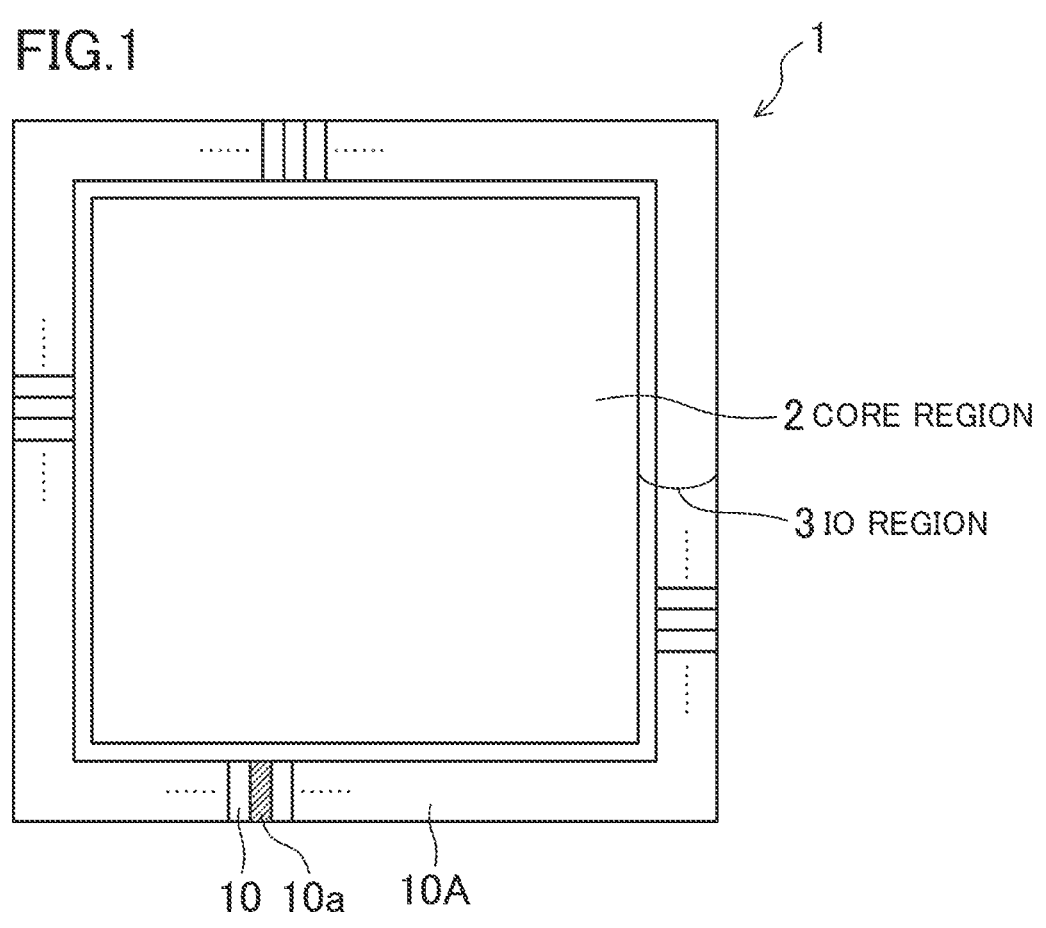
FIG. 1 is a plan view schematically showing the entire configuration of a semiconductor integrated circuit device according to an embodiment.

FIG. 1 is a plan view schematically showing the entire configuration of a semiconductor integrated circuit device according to an embodiment. A semiconductor integrated circuit device 1 shown in FIG. 1 includes: a core region 2 in which internal core circuits are formed; and an IO region 3 provided between the core region 2 and the chip edges, in which interface circuits (IO circuits) are formed. An IO cell row 10A is provided in the IO region 3 to encircle the peripheral portion of the semiconductor integrated circuit device 1. Although illustration is simplified in FIG. 1, a plurality of IO cells 10 constituting interface circuits are arranged in line in the IO cell row 10A. Also, although illustration is omitted in FIG. 1, a plurality of external connection pads are placed in the semiconductor integrated circuit device 1. Note that the IO cell row 10A may be provided in part of the peripheral portion of the semiconductor integrated circuit device 1.

The IO cells 10 include signal IO cells and power IO cells. The signal IO cells include circuits required to exchange signals with the outside of the semiconductor integrated circuit device 1 or with the core region 2, such as a level shifter circuit, an output buffer circuit, and a circuit for ESD protection. The power IO cells, which supply power fed to the external connection pads to the inside of the semiconductor integrated circuit device 1, include a circuit for ESD protection, for example.

Figure 2:
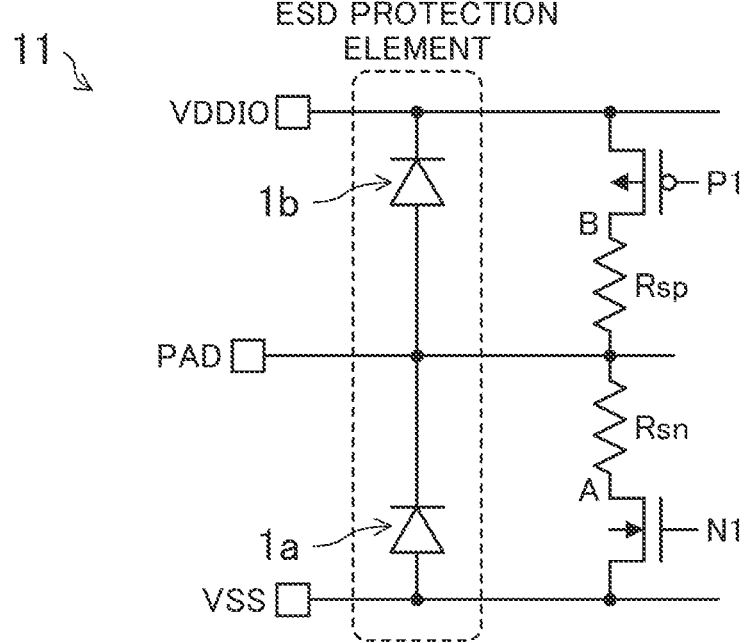
FIG. 2 is a circuit configuration diagram of an output circuit according to the first embodiment.

FIG. 2 is a circuit configuration diagram of an output circuit 11 included in the IO cells 10. Note that, although an actual output circuit includes circuit elements other than those shown in FIG. 2, such elements are omitted in FIG. 2.

The output circuit 11 shown in FIG. 2 includes an external output terminal PAD, output transistors P1 and N1, electrostatic discharge (ESD) protection diodes 1a and 1b, and protective resistances Rsn and Rsp. The output transistor P1 is a p-type transistor and the output transistor N1 is an n-type transistor.

The output transistors P1 and N1 output signals to the external output terminal PAD according to signals received at their gates. The output transistor P1 is connected to VDDIO at its source and to the external output terminal PAD at its drain through the protective resistance Rsp. The output transistor N1 is connected to VSS at its source and to the external output terminal PAD at its drain through the protective resistance Rsn. In this embodiment, the protective resistances Rsp and Rsn are each constituted by a plurality of resistor elements formed in an interconnect layer that is formed in the back end of line (BEOL: interconnect process). Note that the node between the output transistor N1 and the protective resistance Rsn is herein called node A and the node between the output transistor P1 and the protective resistance Rsp is called node B.

The ESD protection diode 1a is provided between VSS and the external output terminal PAD, with its anode connected to VSS and its cathode connected to the external output terminal PAD. The ESD protection diode 1b is provided between VDDIO and the external output terminal PAD, with its anode connected to the external output terminal PAD and its cathode connected to VDDIO. When high-voltage noise is input into the external output terminal PAD, a current flows to VDDIO and VSS through the ESD protection diodes 1a and 1b, thereby protecting the output transistors P1 and N1.

Figure 3:
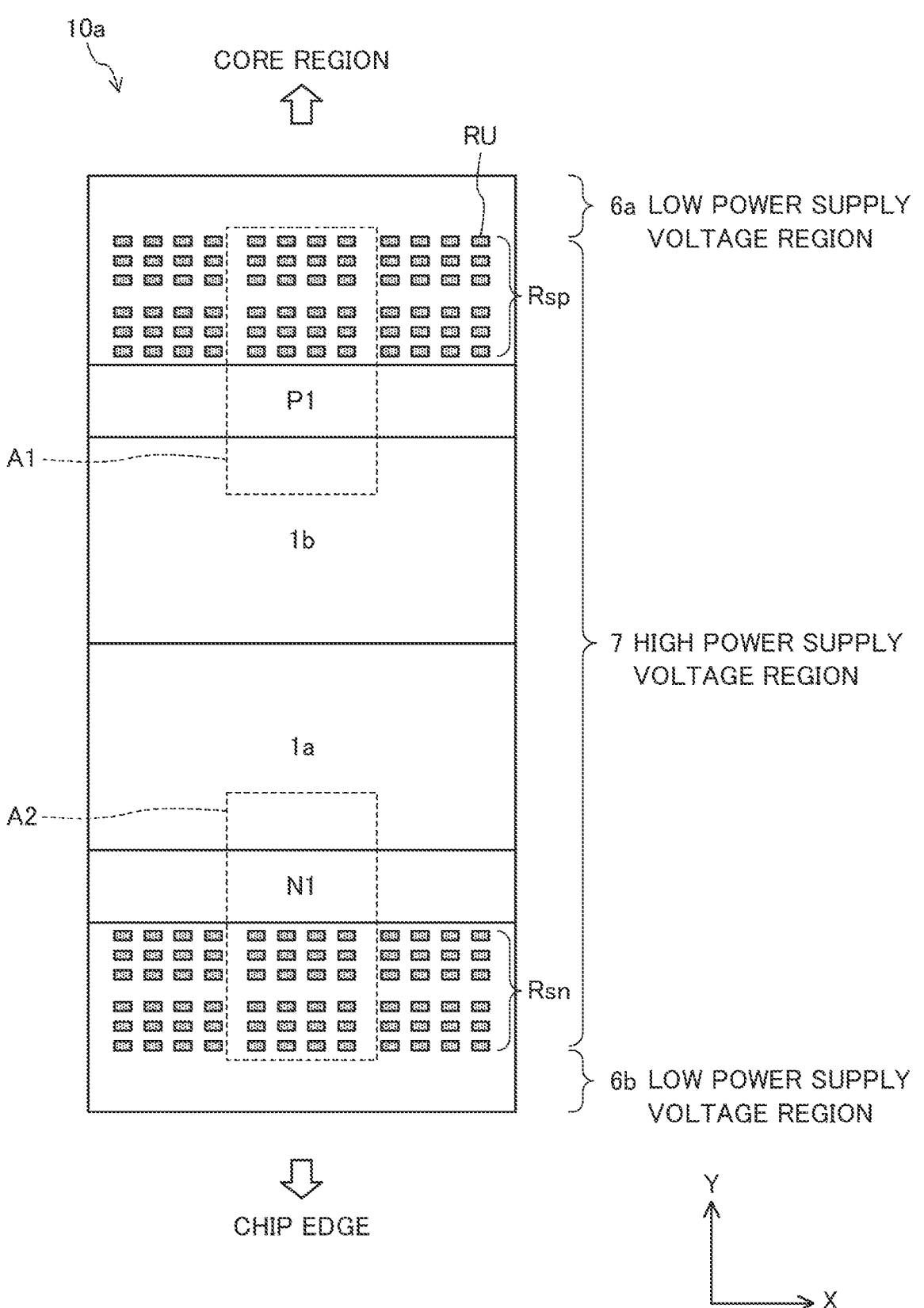
FIG. 3 shows an overview example of IO cell layout in the first embodiment.

FIG. 3 shows an overview example of the IO cell layout. The layout of FIG. 3 corresponds to an IO cell 10a, one of the IO cells 10 arranged along the lower edge of the semiconductor integrated circuit device 1 in FIG. 1. Note herein that the X direction (corresponding to the first direction) is the direction along an outer edge of the semiconductor integrated circuit device 1, along which a plurality of IO cells 10 are arranged, and the Y direction (corresponding to the second direction) is the direction perpendicular to the X direction.

An IO cell generally includes: a high power supply voltage region including a circuit for ESD protection and an output buffer for outputting a signal to the outside of the semiconductor integrated circuit device; and a low power supply voltage region including a circuit for inputting/outputting a signal into/from the inside of the semiconductor integrated circuit device. The IO cell 10a of FIG. 3 has two low power supply voltage regions 6a and 6b and a high power supply voltage region 7 separated from one another in the Y direction. The low power supply voltage region 6a is located closer to the core region 2 and the low power supply voltage region 6b is located closer to the chip edge. The high power supply voltage region 7 is located between the low power supply voltage region 6a and the low power supply voltage region 6b.

The low power supply voltage region 6a, located near the output transistor P1, includes a circuit that generates a signal input into the gate of the output transistor P1, for example. The low power supply voltage region 6b, located near the output transistor N1, includes a circuit that generates a signal input into the gate of the output transistor N1, for example.

The IO cell 10a shown in FIG. 3 constitutes the output circuit 11 of FIG. 2. In the high power supply voltage region 7, the output transistor N1, the ESD protection diode 1a, the ESD protection diode 1b, and the output transistor P1 are formed in this order from the chip edge. Resistor elements RU are arranged in an array in the X and Y directions above sectors of the high power supply voltage region 7 other than the sectors where the output transistor N1, the ESD protection diode 1a, the ESD protection diode 1b, and the output transistor P1 are placed. The resistor elements RU placed above the sector near the output transistor P1 are mutually connected to constitute the protective resistance Rsp. By placing the protective resistance Rsp above a sector where devices such as transistors constituting another circuit are placed, the area of the IO cell 10a can be reduced. The resistor elements RU placed above the sector near the output transistor N1 are mutually connected to constitute the protective resistance Rsn. By placing the protective resistance Rsn above a sector where devices such as transistors constituting another circuit are placed, the area of the IO cell 10a can be reduced.

The connecting style of the resistor elements RU may be serial connection, parallel connection, or a combination of serial connection and parallel connection. Also, some of the resistor elements RU constituting the protective resistance Rsp may lie above the low power supply voltage region 6a, and some of the resistor elements RU constituting the protective resistance Rsn may lie above the low power supply voltage region 6b.

Figure 4:
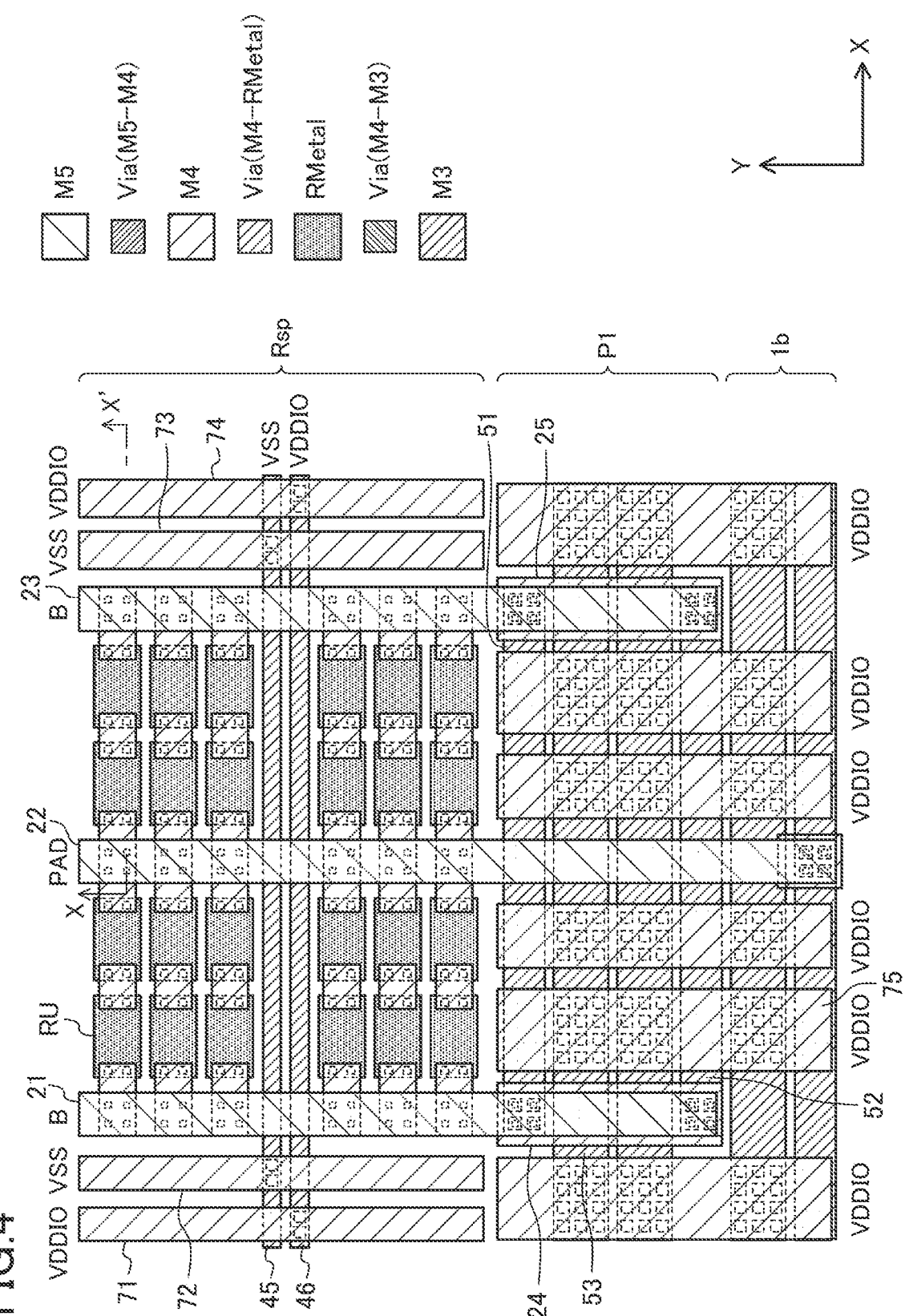
FIG. 4 is a plan view showing details of the IO cell layout of FIG. 3
Figure 5:
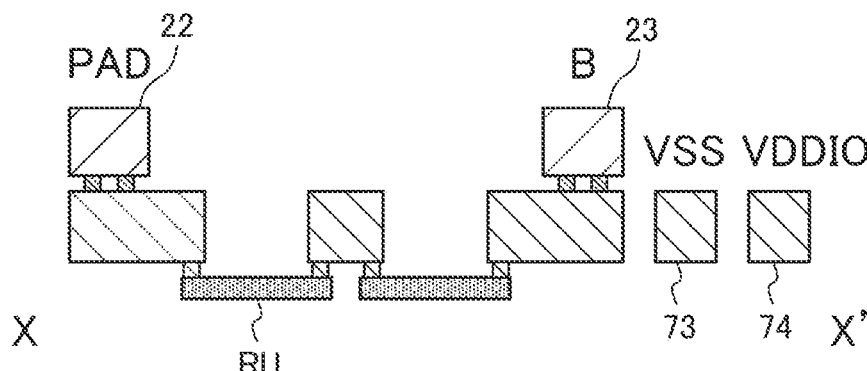
FIG. 5 is a cross-sectional view showing details of the IO cell layout of FIG. 3
Figure 5:
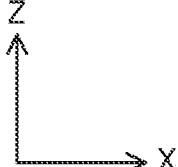

FIGS. 4 and 5 are views showing details of the layout of the IO cell, in which FIG. 4 is a plan view showing the structure of M3 to M5 interconnect layers in part A1 of FIG. 3, and FIG. 5 is a cross-sectional view taken along line X-X' in FIG. 4.

An RMetal interconnect layer, formed between the M4 interconnect layer and the M3 interconnect layer, is a layer for forming the resistor elements RU. The RMetal interconnect layer is formed in the BEOL (interconnect process). The resistor elements RU formed in the RMetal interconnect layer are connected to interconnects in the M4 interconnect layer through vias.

In the M5 interconnect layer, M5 interconnects 21, 22, and 23 extending in the Y direction are formed. The M5 interconnects 21 and 23 correspond to the node B. The M5 interconnect 22 corresponds to the external output terminal PAD and is connected to an IO pad not shown. The M5 interconnects 21 and 23 extend from the sector where the protective resistance Rsp is formed to the portion above the output transistor P1. The M5 interconnect 22 extends from the sector where the protective resistance Rsp is formed to the portion above the output transistor P1 and further to the portion above the ESD protection diode 1b.

In the portion above the output transistor P1, M4 interconnects 24 and 25 extending in the Y direction and M3 interconnects 51 and 52 extending in the X direction are formed. The M4 interconnect 24 overlaps the M5 interconnect 21 in planar view and is connected to the M5 interconnect 21 through vias. The M4 interconnect 25 overlaps the M5 interconnect 23 in planar view and is connected to the M5 interconnect 23 through vias. The M3 interconnect 51 is connected to the M4 interconnects 24 and 25 through vias, and the M3 interconnect 52 is connected to the M4 interconnects 24 and 25 through vias.

The resistor elements RU are formed in the RMetal interconnect layer. Each two of the resistor elements RU are connected in series between the external output terminal PAD and the node B. That is, the resistor elements RU are connected between the node B and the external output terminal PAD through a route of M5 interconnect 21 (node B)→via (M5-M4)→M4 interconnect→via (M4-RMetal)→resistor element RU→via (M4-RMetal)→M4 interconnect→via (M4-Rmetal)→resistor element RU→via (M4-Rmetal)→M4 interconnect→via (M5-M4)→M5 interconnect 22 (PAD). Similarly, each two of the resistor elements RU are connected in series between the M5 interconnect 22 (PAD) and the M5 interconnect 23 (node B). The protective resistance Rsp is constituted by a plurality of such resistor elements RU.

The reason why each two of the resistor elements RU are connected in series between the external output terminal PAD and the node B is to dissipate heat efficiently. That is, with the structure shown in FIG. 4, heat generated in a resistor element RU can be efficiently dissipated from the M4 interconnects connected at both ends of the resistor element RU. Note that three or more resistor elements RU may be connected in series between the external output terminal PAD and the node B. Otherwise, one resistor element RU may be connected between the external output terminal PAD and the node B.

In the sector where the protective resistance Rsp is formed, M4 interconnects 71 and 72 extending in the Y direction are placed on the left side of the M5 interconnect 21 in the figure, and M4 interconnects 73 and 74 extending in the Y direction are placed on the right side of the M5 interconnect 23 in the figure. The M4 interconnects 71 and 74 are power supply lines supplying VDDIO, and the M4 interconnects 72 and 73 are power supply lines supplying VSS. In the sector where the protective resistance Rsp is formed, M3 interconnects 45 and 46 extending in the X direction are placed to reinforce the power supply. The M3 interconnect 45 is connected to the M4 interconnects 72 and 73 through vias, and the M3 interconnect 46 is connected to the M4 interconnects 71 and 74 through vias. The M3 interconnects 45 and 46 may be omitted since they are interconnects for reinforcing the power supply.

Above the output transistor P1 and the ESD protection diode 1b, M3 interconnects 53 and M4 interconnects 75 are formed in a lattice pattern as interconnects supplying VDDIO. The M3 interconnects 53 and the M4 interconnects 75 are mutually connected through vias. The M4 interconnects 75 have overlaps at positions in the X direction with the resistor elements RU. In other words, the M4 interconnects 75 supplying VDDIO are formed at positions in the X coordinate at which the resistor elements RU are formed.

Note that some of the resistor elements RU constituting the protective resistance Rsp may lie above the output transistor P1 or above the ESD protection diode 1b.

Figure 6:
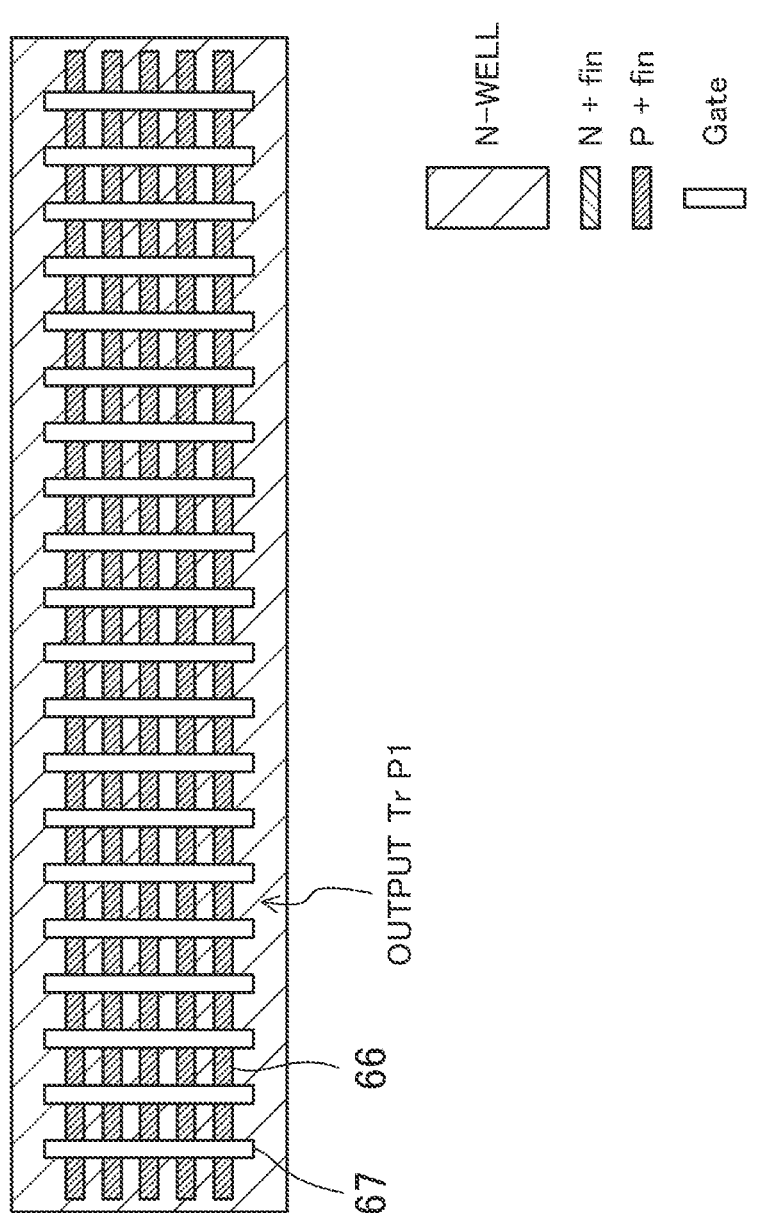
FIG. 6 is a plan view showing a layout of an output transistor.

FIG. 6 shows a layout of the output transistor P1, which includes a plurality of p-type fins 66 extending in the X direction, arranged in order in the Y direction, and a plurality of gate interconnects 67 extending in the Y direction, arranged in order in the X direction. The fins 66 and the gate interconnects 67 overlapping in planar view form transistors. The transistors are mutually connected in parallel through interconnects not shown. The drains of the transistors are connected to the external output terminal PAD through the protective resistance Rsp.

Figure 7:
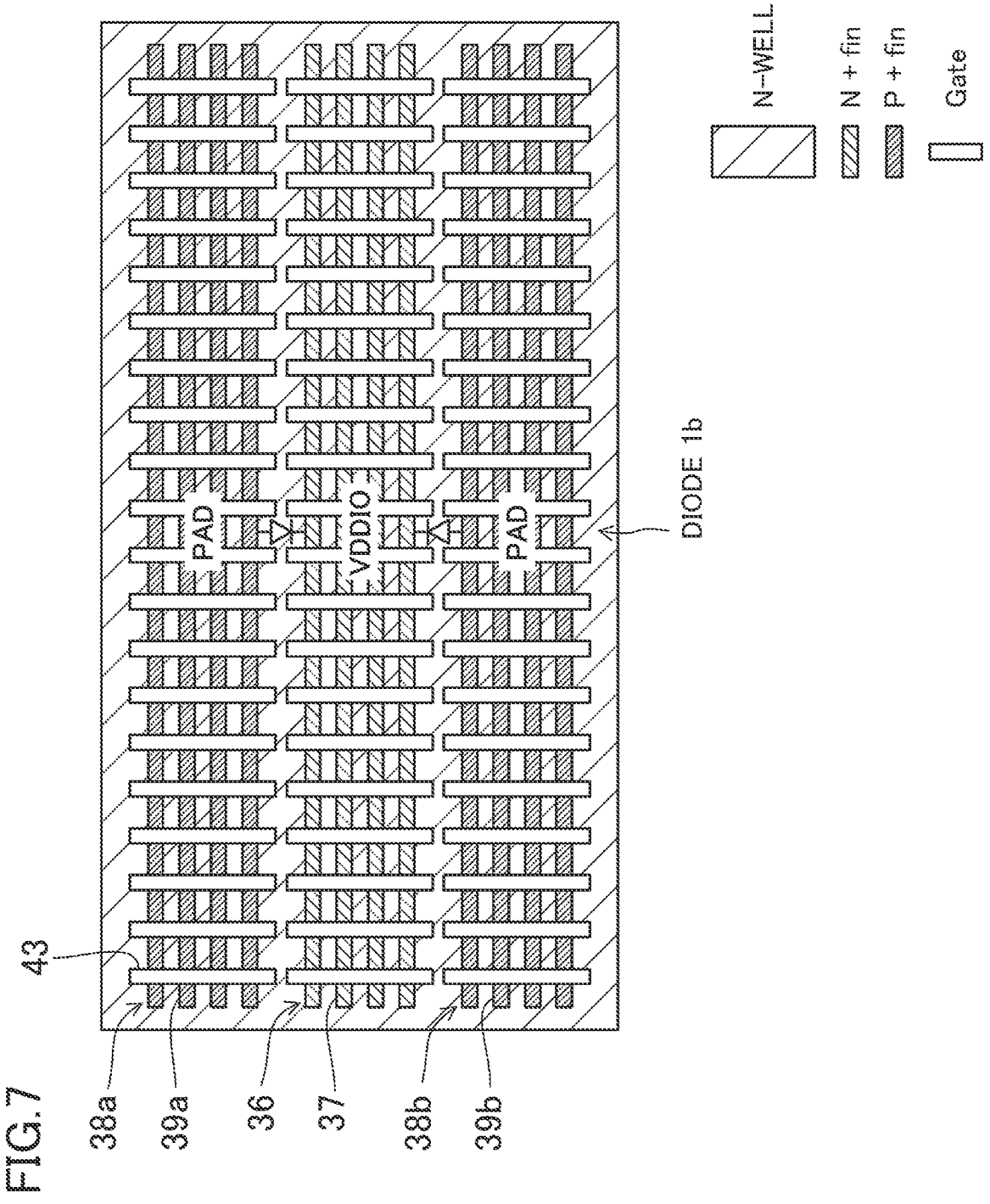
FIG. 7 is a plan view showing a layout of an ESD protection diode.

FIG. 7 shows a layout of the ESD protection diode 1*b*, which includes a cathode part 36 formed of n-type fins 37 and anode parts 38*a* and 38*b* formed of p-type fins 39*a* and 39*b*, respectively. The fins 37, 39*a*, and 39*b* extend in the X direction. The cathode part 36 is connected to VDDIO, and the anode parts 38*a* and 38*b* are connected to the external output terminal PAD. Diodes are formed between the n-type fins 37 and the p-type fins 39*a* and 39*b*.

Figure 8:
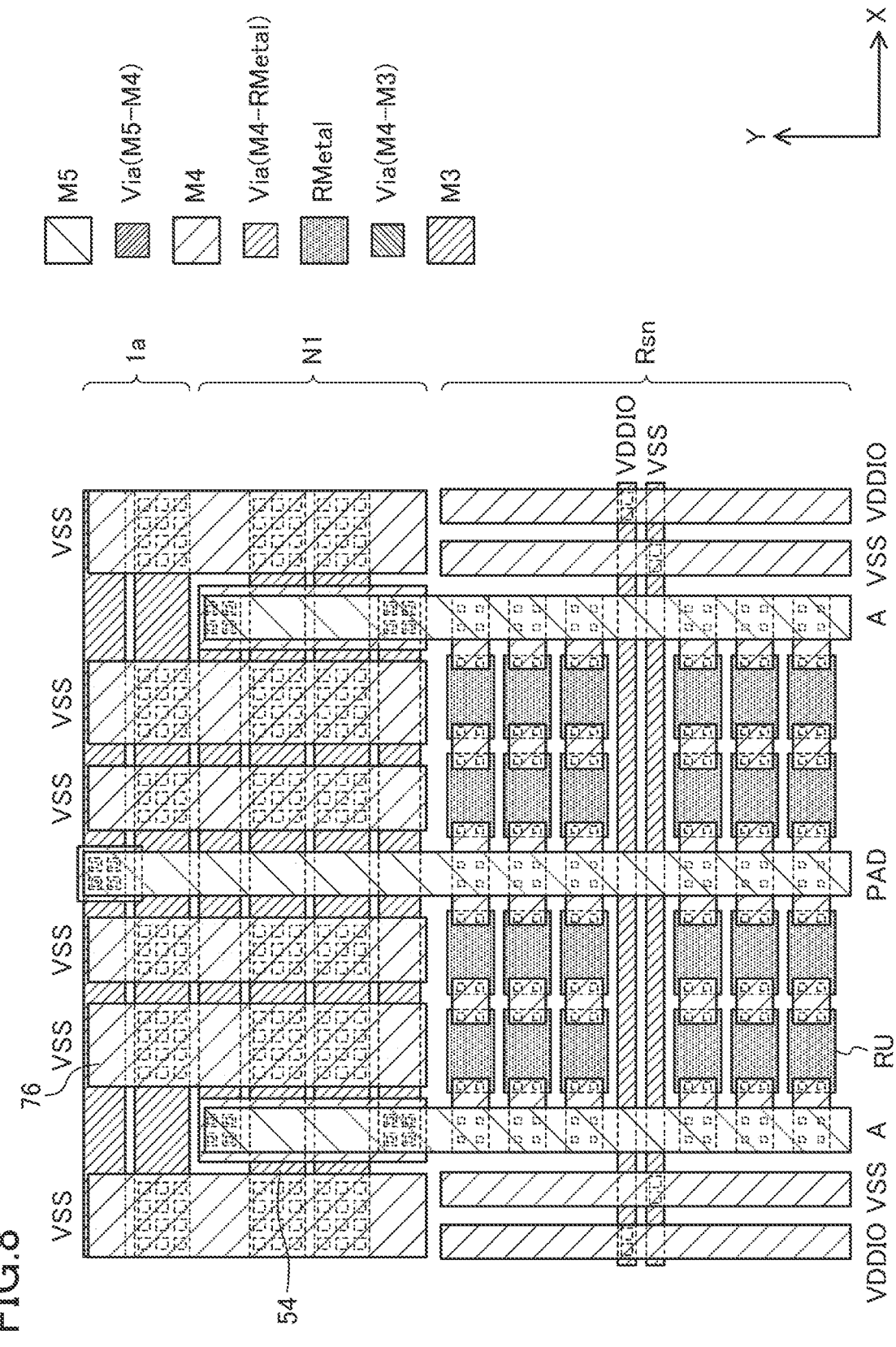
FIG. 8 is a plan view showing details of the IO cell layout of FIG. 3

FIG. 8 is a plan view showing the structure of the M3 to M5 interconnect layers in part A2 of FIG. 3, showing a layout of a sector where the protective resistance Rsn is formed and sectors above the output transistor N1 and the ESD protection diode 1*a*. The layout of FIG. 8 corresponds to the vertically inverted one of the layout of FIG. 4 with VDDIO changed to VSS and the node B changed to the node A. Since the layout of FIG. 8 is easily understandable from the description on the layout of FIG. 4, detailed description thereof is omitted here.

The resistor elements RU are formed in the RMetal interconnect layer. Each two of the resistor elements RU are connected in series between the external output terminal PAD and the node A. The protective resistance Rsn is constituted by a plurality of such resistor elements RU.

Above the output transistor N1 and the ESD protection diode 1*a*, M3 interconnects 54 and M4 interconnects 76 are formed in a lattice pattern as interconnects supplying VSS. The M3 interconnects 54 and the M4 interconnects 76 are mutually connected through vias. The M4 interconnects 76 have overlaps at positions in the X direction with the resistor elements RU. In other words, the M4 interconnects 76 supplying VSS are formed at positions in the X coordinate at which the resistor elements RU are formed.

Note that some of the resistor elements RU constituting the protective resistance Rsn may lie above the output transistor N1 or above the ESD protection diode 1*a*.

Figure 9:
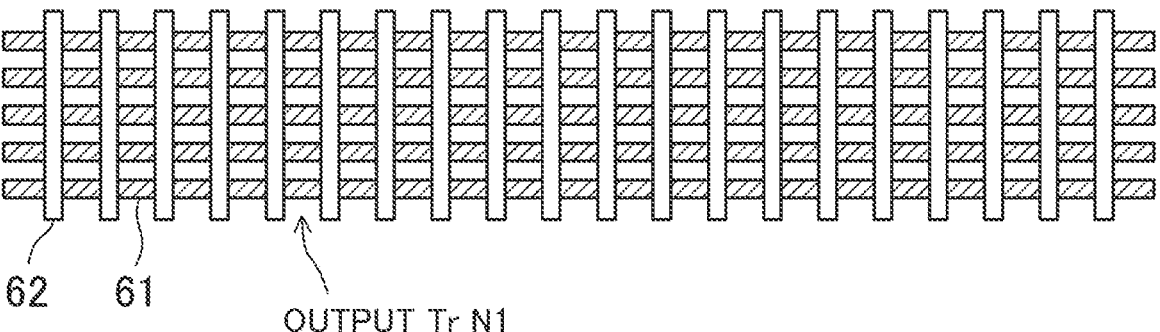
FIG. 9 is a plan view showing a layout of an output transistor.

FIG. 9 shows a layout of the output transistor N1. As shown in FIG. 9, the output transistor N1 includes a plurality of n-type fins 61 extending in the X direction, arranged in order in the Y direction, and a plurality of gate interconnects 62 extending in the Y direction, arranged in order in the X direction. The fins 61 and the gate interconnects 62 overlapping in planar view form transistors. The transistors are mutually connected in parallel through interconnects not shown. The drains of the transistors are connected to the external output terminal PAD through the protective resistance Rsn.

Figure 10:
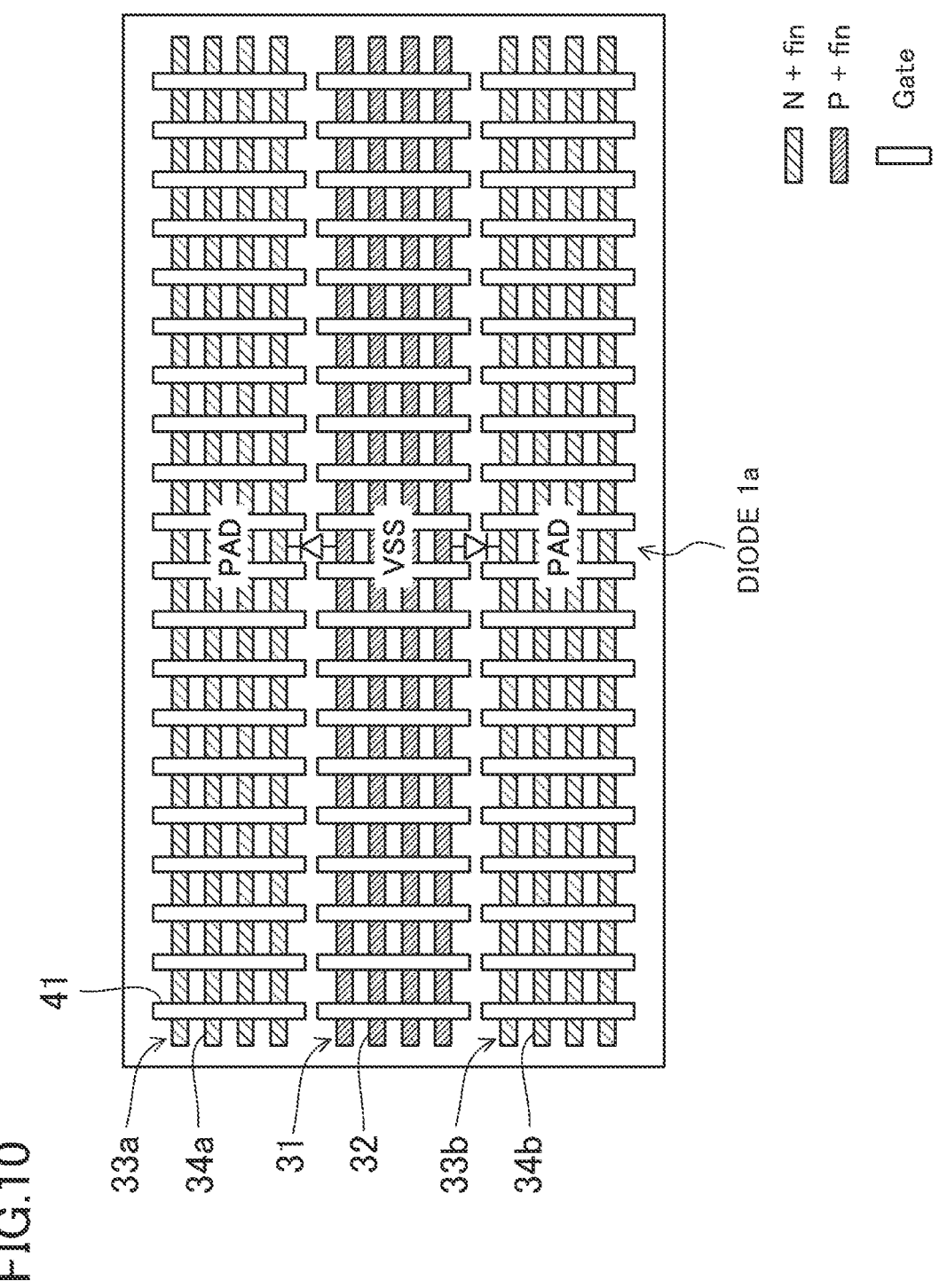
FIG. 10 is a plan view showing a layout of an ESD protection diode.

FIG. 10 shows a layout of the ESD protection diode 1*a*. As shown in FIG. 10, the ESD protection diode 1*a* includes an anode part 31 formed of p-type fins 32 and cathode parts 33*a* and 33*b* formed of n-type fins 34*a* and 34*b*, respectively. The fins 32, 34*a*, and 34*b* extend in the X direction. The anode part 31 is connected to VSS, and the cathode parts 33*a* and 33*b* are connected to the external output terminal PAD. Diodes are formed between the p-type fins 32 and the n-type fins 34*a* and 34*b*.

According to this embodiment, advantages as follows are obtained. That is, in the configuration of this embodiment, the resistor elements RU constituting the protective resistances Rsp and Rsn are placed above sectors other than the sectors where the output transistors P1 and N1 and the ESD protection diodes 1*a* and 1*b* are placed. With this, power supply lines for VDDIO and VSS can be provided abundantly in the interconnect layers above the output transistors P1 and N1 and the ESD protection diodes 1*a* and 1*b*.

With the above configuration, for the output transistors P1 and N1, a large current can be sufficiently passed through the transistors. Therefore, since the interconnect resistance decreases to prevent or reduce the voltage drop, the operating frequency is prevented from degrading and the quality of the signal waveform is improved. For the ESD protection diodes 1*a* and 1*b*, since the resistance values of the routes from the power supply to the diodes can be reduced, good ESD protection characteristics can be obtained.

Second Embodiment

Figure 11:
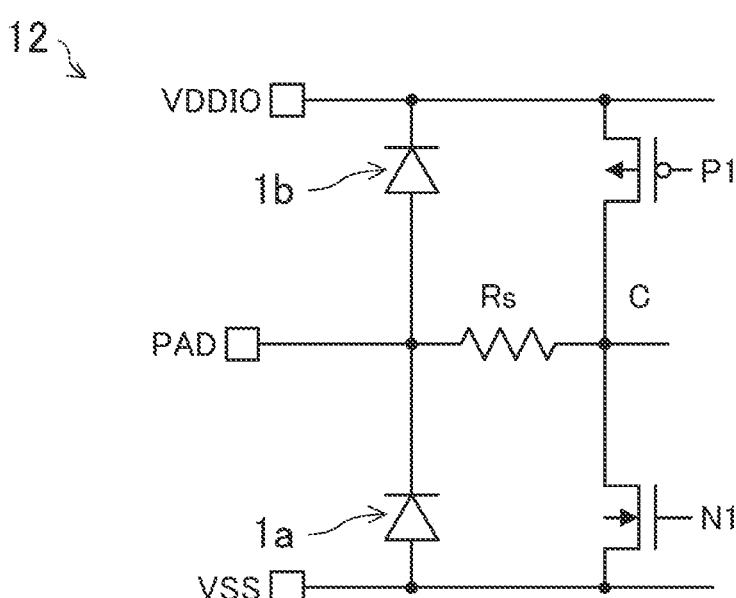
FIG. 11 is a circuit configuration diagram of an output circuit according to the second embodiment.

FIG. 11 is a circuit configuration diagram of an output circuit 12 according to this embodiment. The circuit configuration of FIG. 11 is similar to the circuit configuration of FIG. 2 in the first embodiment, except for the position of insertion of a protective resistance. That is, in the output circuit 12 of FIG. 11, a protective resistance Rs is provided in place of the protective resistances Rsn and Rsp in FIG. 2. In FIG. 11, the drains of the output transistors P1 and N1 are mutually connected, and the protective resistance Rs is provided between the external output terminal PAD and the drains of the output transistors P1 and N1. Note that the node between the drains of the output transistors P1 and N1 and the protective resistance Rs is herein called node C.

Figure 12:
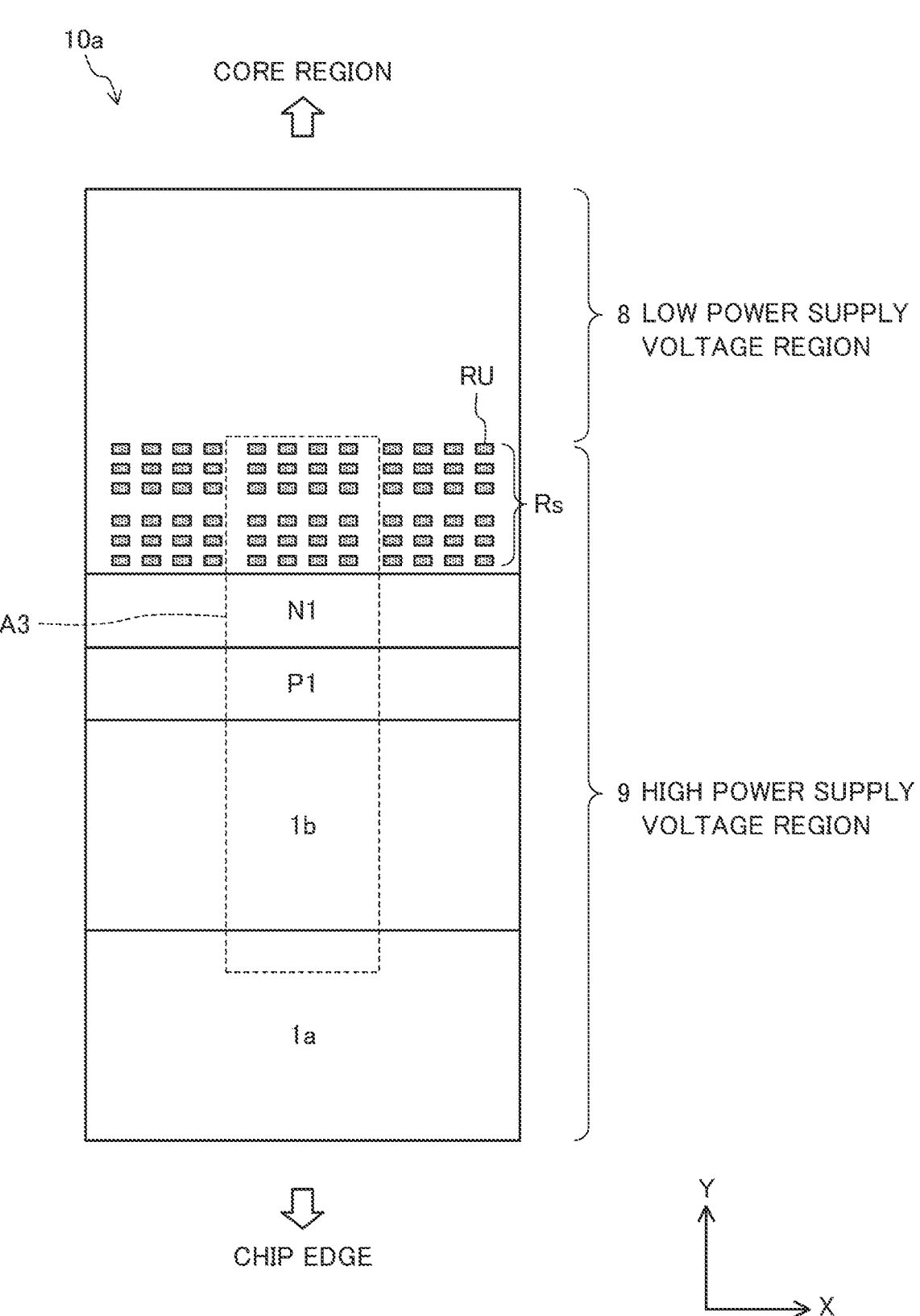
FIG. 12 shows an overview example of IO cell layout in the second embodiment.

FIG. 12 shows an overview example of the layout of an IO cell. The layout of FIG. 12 corresponds to the IO cell 10*a*, one of the IO cells 10 arranged along the lower edge of the semiconductor integrated circuit device 1 in FIG. 1. In the IO cell layout of FIG. 12, the placement of the high power supply voltage region and the low power supply voltage region is different from that in the IO cell layout of FIG. 3. The IO cell 10*a* of FIG. 12 has a low power supply voltage region 8 and a high power supply voltage region 9 separated from each other in the Y direction. The low power supply voltage region 8 is located closer to the core region 2 and the high power supply voltage region 9 is located closer to the chip edge.

The IO cell 10*a* shown in FIG. 12 constitutes the output circuit 12 of FIG. 11. In the high power supply voltage region 9, the ESD protection diode 1*a*, the ESD protection diode 1*b*, the output transistor P1, and the output transistor N1 are placed in this order from the chip edge. In the high power supply voltage region 9, resistor elements RU are arranged in an array in the X and Y directions above a sector other than the sectors where the ESD protection diode 1*a*, the ESD protection diode 1*b*, the output transistor P1, and the output transistor N1 are placed. The resistor elements RU are mutually connected to constitute the protective resistance Rs. By placing the protective resistance Rs above a sector where devices such as transistors constituting another circuit are placed, the area of the IO cell 10*a* can be reduced.

The connecting style of the resistor elements RU may be serial connection, parallel connection, or a combination of serial connection and parallel connection. Also, some of the resistor elements RU constituting the protective resistance Rs may lie above the low power supply voltage region 8.

The order of the placement of the ESD protection diode 1*a*, the ESD protection diode 1*b*, the output transistor P1, and the output transistor N1 is not limited to that shown in FIG. 12. For example, the placement positions of the output transistor P1 and the output transistor N1 may be changed with each other, and the placement positions of the ESD protection diode 1*a* and the ESD protection diode 1*b* may be changed with each other.

Figure 13:
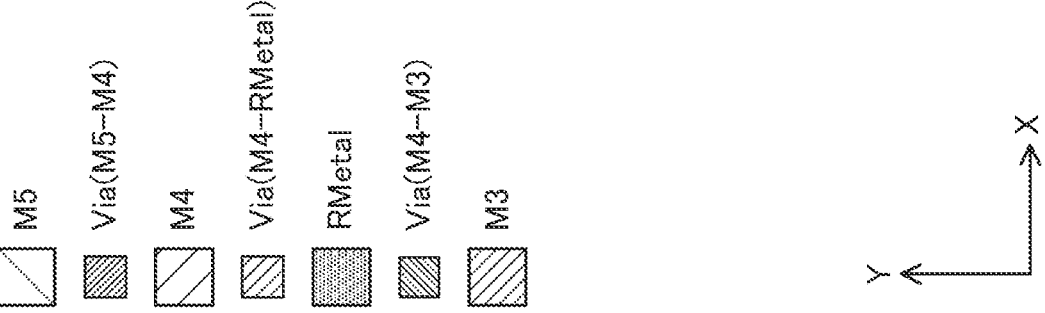
FIG. 13 is a plan view showing details of the IO cell layout of FIG. 12.
Figure 13:
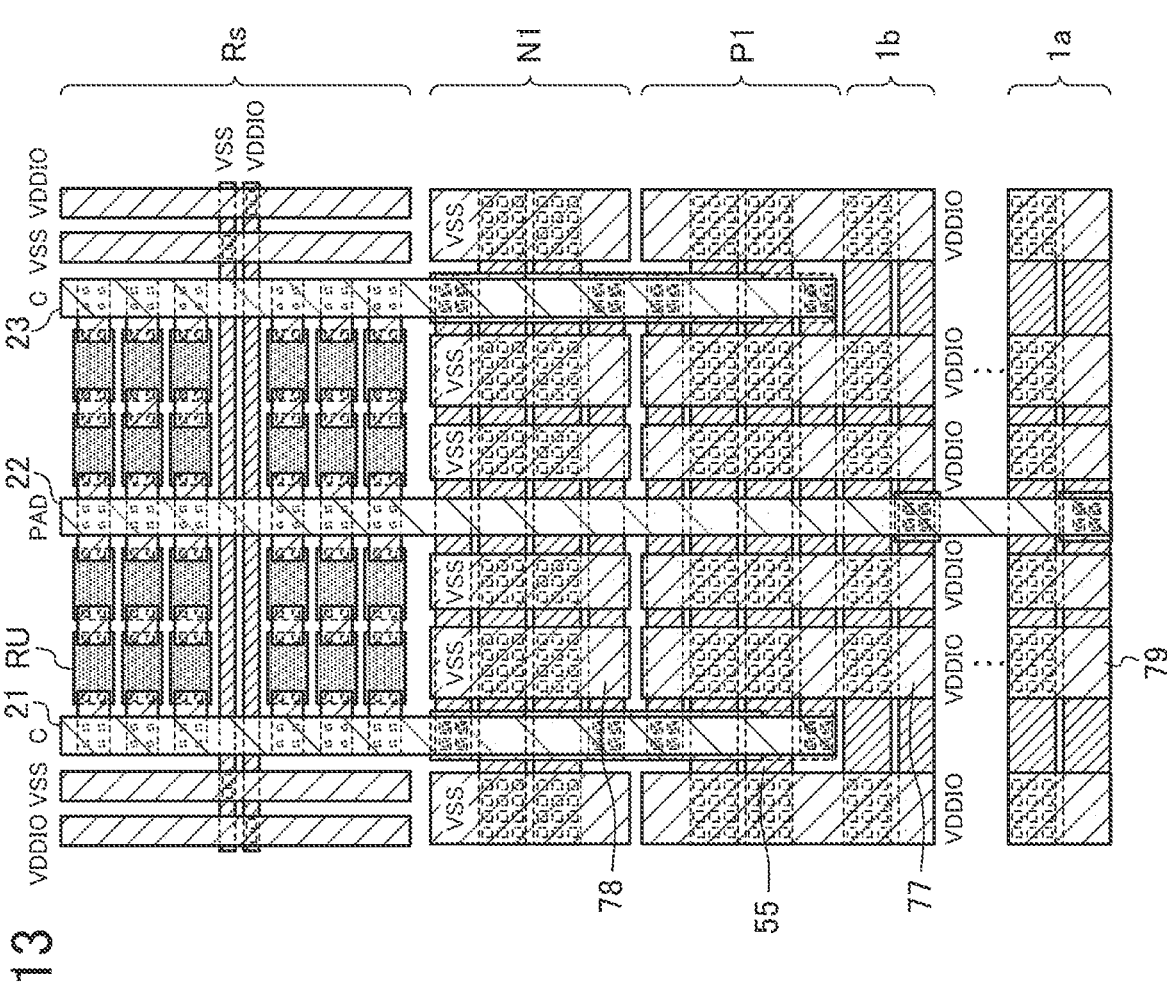

FIG. 13 is a plan view showing details of the layout of an IO cell, which shows the structure of M3 to M5 interconnect layers in part A3 of FIG. 12. Note that the cross-sectional structure and the configurations of layers below the layers in FIG. 13 are similar to those in the first embodiment and therefore illustration thereof is omitted here.

The layout of FIG. 13 is similar to the layout of FIG. 4 in the first embodiment, except that the M5 interconnects 21 and 23 correspond to the node C, not the node B.

The resistor elements RU are formed in the RMetal interconnect layer. Each two of the resistor elements RU are connected in series between the external output terminal PAD and the node C. That is, the resistor elements RU are connected between the node C and the external output terminal PAD through a route of M5 interconnect 21 (node C)→via (M5-M4)→M4 interconnect→via (M4-RMetal) →resistor element RU→via (M4-RMetal)→M4 interconnect→via (M4-Rmetal)→resistor element RU→via (M4-Rmetal)→M4 interconnect→via (M5-M4)→M5 interconnect 22 (PAD). Between the M5 interconnect 22 (PAD) and the M5 interconnect 23 (node C), also, the resistor elements RU are connected in a similar way. The protective resistance Rs is constituted by a plurality of such resistor elements RU.

Above the output transistor P1 and the ESD protection diode 1*b*, M3 interconnects 55 and M4 interconnects 77 are formed in a lattice pattern as interconnects supplying VDDIO. The M3 interconnects 55 and the M4 interconnects 77 are mutually connected through vias. The M4 interconnects 77 have overlaps at positions in the X direction with the resistor elements RU. In other words, the M4 interconnects 77 supplying VDDIO are formed at positions in the X coordinate at which the resistor elements RU are formed.

Above the output transistor N1 and the ESD protection diode 1*a*, M4 interconnects 78 and 79 are respectively formed as interconnects supplying VSS. The M4 interconnects 78 and 79 have overlaps at positions in the X direction with the resistor elements RU. In other words, the M4 interconnects 78 and 79 supplying VSS are formed at positions in the X coordinate at which the resistor elements RU are formed.

Note that some of the resistor elements RU constituting the protective resistance Rs may lie above the output transistor P1, N1 or above the ESD protection diode 1*a*, 1*b*.

In this embodiment, advantages similar to those in the first embodiment are obtained. That is, in the configuration of this embodiment, the resistor elements RU constituting the protective resistance Rs are placed above a sector other than the sectors where the output transistors P1 and N1 and the ESD protection diodes 1*a* and 1*b* are placed. With this, power supply lines for VDDIO and VSS can be provided abundantly in the interconnect layers above the output transistors P1 and N1 and the ESD protection diodes 1*a* and 1*b*.

With the above configuration, for the output transistors P1 and N1, a large current can be sufficiently passed through the transistors. Therefore, since the interconnect resistance decreases to prevent or reduce the voltage drop, the operating frequency is prevented from degrading and the quality of the signal waveform is improved. For the ESD protection diodes 1*a* and 1*b*, since the resistance values of the routes from the power supply to the diodes can be reduced, good ESD protection characteristics can be obtained.

Alteration of Second Embodiment

Figure 14:
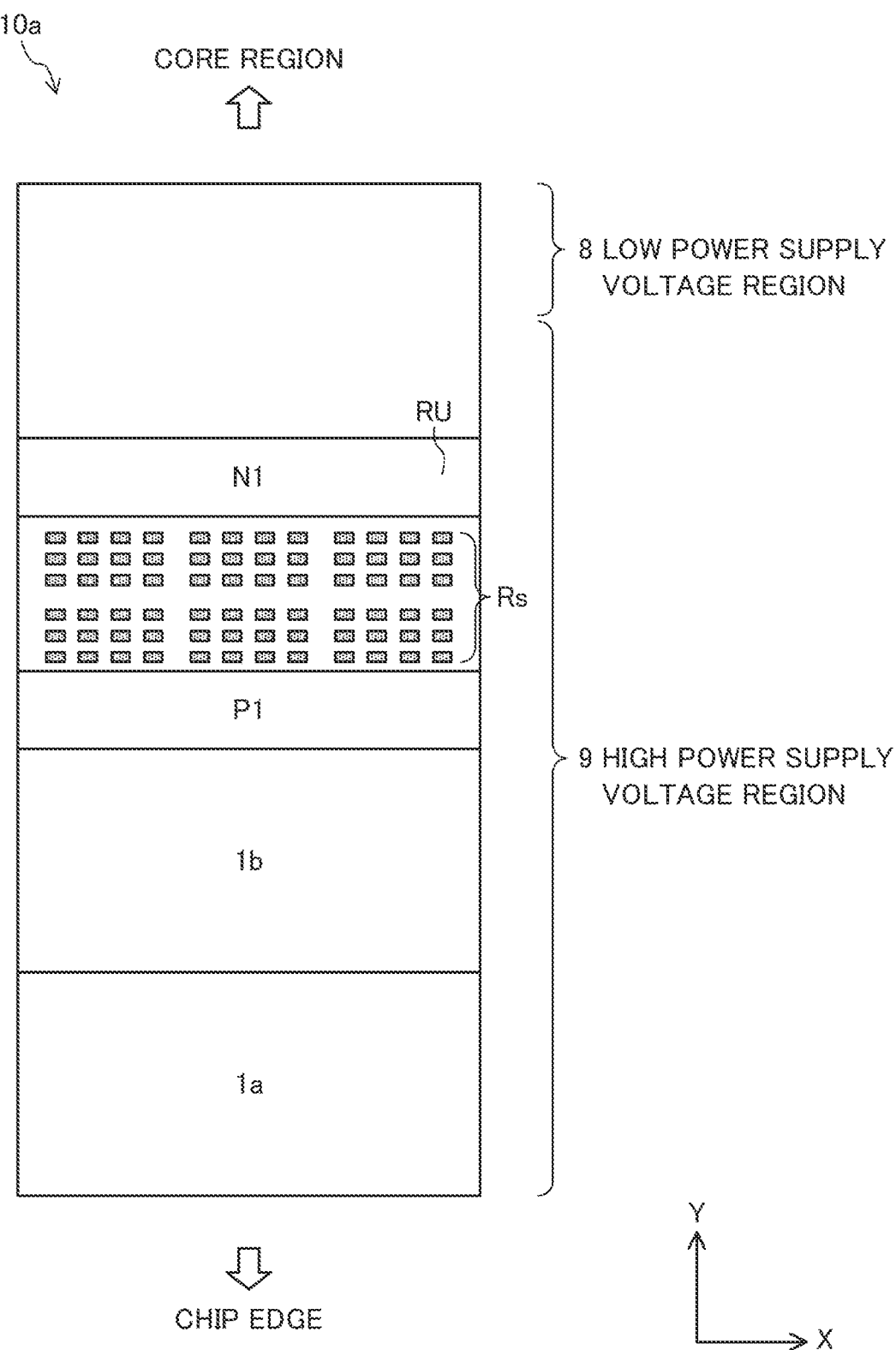
FIG. 14 shows an overview example of IO cell layout in an alteration.

FIG. 14 shows an overview of IO cell layout in an alteration of the second embodiment. In the layout of FIG.

14, in comparison with the layout of FIG. 12, the placement position of the output transistor N1 is shifted upward as viewed in the figure. The protective resistance Rs is placed between the output transistor N1 and the output transistor P1.

According to this alteration, the following advantage is obtained in addition to the advantages in the second embodiment. Since the output transistor N1 and the output transistor P1 are placed on both sides of the protective resistance Rs, the length of the interconnects between the protective resistance Rs and the output transistor N1 and the length of the interconnects between the protective resistance Rs and the output transistor P1 can be made roughly equal to each other. This can improve the unbalancing in interconnect parasitic components.

Note that some of the resistor elements RU constituting the protective resistance Rs may lie above the output transistors P1 and N1.

Note that while the ESD protection diodes 1*a* and 1*b* and the output transistors N1 and P1 are constituted by fins in the above embodiments, the configuration is not limited to this.

While the p-type transistors and the n-type transistors are all single-stage transistors in the output circuits in the above embodiments, the configuration is not limited to this. For example, they may be plural-stage transistors, such as two- or three-stage transistors, connected in series. Also, in the above embodiments, the output circuit can be an input/output circuit including an input circuit.

While the RMetal interconnect layer is formed between the M4 interconnect layer and the M3 interconnect layer in the above embodiments, the configuration is not limited to this. It is only required to form the RMetal interconnect layer in the BEOL.

According to the present disclosure, in a semiconductor integrated circuit device using resistor elements formed in the BEOL, the ESD tolerance can be improved. The present disclosure is therefore useful for improving the performance of system LSI, for example.

The invention claimed is:

1. A semiconductor integrated circuit device comprising a plurality of IO cells arranged in a first direction, wherein at least one of the plurality of IO cells includes an output circuit, the output circuit includes an external output terminal, a first electrostatic discharge (ESD) protection diode connected to the external output terminal at its first node and to a first power supply at its second node, a first protective resistance constituted by a plurality of resistor elements formed in a first interconnect layer, the first interconnect layer being formed in an interconnect process (back end of line (BEOL)), one of ends of the first protective resistance being connected to the external output terminal, and a first output transistor connected between the other end of the first protective resistance and the first power supply, the plurality of resistor elements of the first protective resistance are connected to interconnects formed in a second interconnect layer through vias, in the second interconnect layer, a first power supply line supplying power from the first power supply is formed above the first ESD protection diode, and the first power supply line has an overlap at a position in the first direction with any of the plurality of resistor elements of the first protective resistance.

2. The semiconductor integrated circuit device of claim 1, wherein the plurality of resistor elements of the first protective resistance include two or more resistor elements connected in series between the external output terminal and the first output transistor.

3. The semiconductor integrated circuit device of claim 1, wherein the plurality of resistor elements of the first protective resistance are arranged in an array in the first direction and in a second direction perpendicular to the first direction in the first interconnect layer.

4. The semiconductor integrated circuit device of claim 1, wherein the output circuit includes a second ESD protection diode connected to a second power supply at its first node and to the external output terminal at its second node, a second protective resistance constituted by a plurality of resistor elements formed in the first interconnect layer, one of ends of the second protective resistance being connected to the external output terminal, and a second output transistor connected between the other end of the second protective resistance and the second power supply, the plurality of resistor elements of the second protective resistance are connected to interconnects formed in the second interconnect layer through vias, in the second interconnect layer, a second power supply line supplying power from the second power supply is formed above the second ESD protection diode, and the second power supply line has an overlap at a position in the first direction with any of the plurality of resistor elements of the second protective resistance.

5. The semiconductor integrated circuit device of claim 1, wherein the output circuit includes a second ESD protection diode connected to a second power supply at its first node and to the external output terminal at its second node, and a second output transistor connected between the other end of the first protective resistance and the second power supply, in the second interconnect layer, a second power supply line supplying power from the second power supply is formed above the second ESD protection diode, and the second power supply line has an overlap at a position in the first direction with any of the plurality of resistor elements of the first protective resistance.

6. A semiconductor integrated circuit device comprising a plurality of IO cells arranged in a first direction, wherein at least one of the plurality of IO cells includes an output circuit, the output circuit includes an external output terminal, a first electrostatic discharge (ESD) protection diode connected to the external output terminal at its first node and to a first power supply at its second node, a first protective resistance constituted by a plurality of resistor elements formed in a first interconnect layer, the first interconnect layer being formed in an interconnect process (back end of line (BEOL)), one of ends of the first protective resistance being connected to the external output terminal, and a first output transistor connected between the other end of the first protective resistance and the first power supply, the plurality of resistor elements of the first protective resistance are connected to interconnects formed in a second interconnect layer through vias, in the second interconnect layer, a first power supply line supplying power from the first power supply is formed above the first output transistor, and the first power supply line has an overlap at a position in the first direction with any of the plurality of resistor elements of the first protective resistance.

7. The semiconductor integrated circuit device of claim 6, wherein the plurality of resistor elements of the first protective resistance include two or more resistor elements connected in series between the external output terminal and the first output transistor.

8. The semiconductor integrated circuit device of claim 6, wherein the plurality of resistor elements of the first protective resistance are arranged in an array in the first direction and in a second direction perpendicular to the first direction in the first interconnect layer.

9. The semiconductor integrated circuit device of claim 6, wherein the output circuit includes a second ESD protection diode connected to a second power supply at its first node and to the external output terminal at its second node, a second protective resistance constituted by a plurality of resistor elements formed in the first interconnect layer, one of ends of the second protective resistance being connected to the external output terminal, and a second output transistor connected between the other end of the second protective resistance and the second power supply, the plurality of resistor elements of the second protective resistance are connected to interconnects formed in the second interconnect layer through vias, in the second interconnect layer, a second power supply line supplying power from the second power supply is formed above the second output transistor, and the second power supply line has an overlap at a position in the first direction with any of the plurality of resistor elements of the second protective resistance.

10. The semiconductor integrated circuit device of claim 6, wherein the output circuit includes a second ESD protection diode connected to a second power supply at its first node and to the external output terminal at its second node, and a second output transistor connected between the other end of the first protective resistance and the second power supply, in the second interconnect layer, a second power supply line supplying power from the second power supply is formed above the second output transistor, and the second power supply line has an overlap at a position in the first direction with the plurality of resistor elements of the first protective resistance.

* * * * *